United States Patent
Tang et al.

(10) Patent No.: US 12,262,486 B2
(45) Date of Patent: Mar. 25, 2025

(54) ELECTRONIC DEVICE COVER AND ELECTRONIC DEVICE COMPONENT

(71) Applicant: Huawei Technologies Co., Ltd., Shenzhen (CN)

(72) Inventors: Yinzhong Tang, Dongguan (CN); Na Wang, Chengdu (CN); Shanjiu Chi, Dongguan (CN); Zhengquan Wang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 217 days.

(21) Appl. No.: 17/871,404

(22) Filed: Jul. 22, 2022

(65) Prior Publication Data

US 2022/0361346 A1    Nov. 10, 2022

Related U.S. Application Data

(63) Continuation of application No. PCT/CN2020/142419, filed on Dec. 31, 2020.

(30) Foreign Application Priority Data

Jan. 23, 2020 (CN) .......................... 202010076923.0
Feb. 12, 2020 (CN) .......................... 202010089378.9

(51) Int. Cl.
*H05K 5/02*       (2006.01)
(52) U.S. Cl.
CPC .................................. *H05K 5/0213* (2013.01)
(58) Field of Classification Search
CPC .................................................... H05K 5/0213
USPC ........................................................... 361/690
See application file for complete search history.

(56) References Cited

U.S. PATENT DOCUMENTS

| | | | | |
|---|---|---|---|---|
| 5,914,858 A * | 6/1999 | McKeen | ............ | H05K 7/20563 454/186 |
| 5,995,368 A * | 11/1999 | Lee | ..................... | H05K 7/20572 361/695 |
| 6,504,713 B1 * | 1/2003 | Pandolfi | ................ | G06F 1/1601 345/87 |
| 7,012,807 B2 * | 3/2006 | Chu | .......................... | G06F 1/20 165/80.4 |
| 7,154,748 B2 * | 12/2006 | Yamada | ............. | H05K 7/20572 361/695 |

(Continued)

FOREIGN PATENT DOCUMENTS

| | | |
|---|---|---|
| CN | 101965120 A | 2/2011 |
| CN | 103596391 A | 2/2014 |

(Continued)

*Primary Examiner* — Anatoly Vortman
(74) *Attorney, Agent, or Firm* — Conley Rose, P.C.

(57) ABSTRACT

An electronic device cover is configured to accommodate an electronic device. A first air intake window and a first air exhaust window are disposed on the electronic device cover. The first air intake window is configured to communicate with an air intake vent of the electronic device to form an air intake channel, and the first air exhaust window is configured to communicate with an air exhaust vent of the electronic device to form an air exhaust channel. An air return channel is disposed inside the electronic device, and the air return channel is configured to communicate the air exhaust channel and the air intake channel.

20 Claims, 5 Drawing Sheets

(56) References Cited

U.S. PATENT DOCUMENTS

| | | | | |
|---|---|---|---|---|
| 7,259,961 B2* | 8/2007 | Lucero | | H05K 7/20563 |
| | | | | 361/695 |
| 7,652,891 B2* | 1/2010 | Lucero | | G06F 1/20 |
| | | | | 361/752 |
| 7,778,013 B2* | 8/2010 | Bruski | | H02B 1/56 |
| | | | | 361/678 |
| 7,813,121 B2* | 10/2010 | Bisson | | H05K 7/20736 |
| | | | | 361/679.53 |
| 7,826,216 B2* | 11/2010 | Moss | | H05K 7/20736 |
| | | | | 361/679.48 |
| 7,903,403 B2* | 3/2011 | Doll | | G06F 1/20 |
| | | | | 361/679.48 |
| 7,965,504 B2* | 6/2011 | Hamlin | | H05K 7/20572 |
| | | | | 361/679.5 |
| 7,969,727 B2* | 6/2011 | Tozer | | H05K 7/20827 |
| | | | | 361/679.48 |
| 8,125,778 B2* | 2/2012 | Miyoshi | | H05K 7/20145 |
| | | | | 361/695 |
| 8,139,358 B2* | 3/2012 | Tambe | | G06F 1/20 |
| | | | | 165/122 |
| 8,223,492 B2* | 7/2012 | Ji | | H05K 7/20572 |
| | | | | 361/679.48 |
| 8,320,119 B2* | 11/2012 | Isoshima | | H05K 7/20972 |
| | | | | 165/104.34 |
| 8,325,478 B2* | 12/2012 | Siracki | | H05K 7/20918 |
| | | | | 361/679.48 |
| 8,336,672 B2* | 12/2012 | Derks | | F16L 55/0336 |
| | | | | 454/262 |
| 8,446,725 B2* | 5/2013 | Lam | | H05K 7/20145 |
| | | | | 361/679.5 |
| 8,649,173 B2* | 2/2014 | Kimura | | H05K 7/20727 |
| | | | | 361/679.48 |
| 8,780,551 B2* | 7/2014 | Farnholtz | | H05K 7/20727 |
| | | | | 361/679.48 |
| 8,804,334 B2* | 8/2014 | Eckberg | | H05K 7/20718 |
| | | | | 361/679.48 |
| 9,357,679 B2* | 5/2016 | Dong | | H05K 7/20581 |
| 10,952,353 B1* | 3/2021 | Bean, Jr. | | H05K 7/20836 |
| 2007/0159791 A1 | 7/2007 | Pongracz et al. | | |
| 2008/0055846 A1* | 3/2008 | Clidaras | | H05K 7/202 |
| | | | | 361/679.41 |
| 2008/0094799 A1* | 4/2008 | Zieman | | F28F 9/0268 |
| | | | | 361/695 |
| 2009/0109619 A1* | 4/2009 | Wise | | H05K 7/20836 |
| | | | | 361/695 |
| 2011/0235273 A1 | 9/2011 | Tan et al. | | |
| 2012/0155027 A1* | 6/2012 | Broome | | H05K 7/20745 |
| | | | | 361/688 |
| 2014/0071621 A1* | 3/2014 | Dong | | H05K 7/20736 |
| | | | | 361/692 |
| 2014/0098493 A1 | 4/2014 | Chen et al. | | |

FOREIGN PATENT DOCUMENTS

| | | |
|---|---|---|
| CN | 105578813 A | 5/2016 |
| CN | 106817864 A | 6/2017 |
| CN | 108882656 A | 11/2018 |
| JP | 52151001 U | 11/1977 |
| JP | 2008171078 A | 7/2008 |
| JP | 2014049515 A | 3/2014 |
| JP | 2014146085 A | 8/2014 |

* cited by examiner

ELECTRONIC DEVICE COVER AND ELECTRONIC DEVICE COMPONENT

CROSS-REFERENCE TO RELATED APPLICATIONS

This is a continuation of International Patent Application No. PCT/CN2020/142419 filed on Dec. 31, 2020, which claims priority to Chinese Patent Application No. 202010076923.0 filed on Jan. 23, 2020 and Chinese Patent Application No. 202010089378.9 filed on Feb. 12, 2020. All of the aforementioned patent applications are hereby incorporated by reference in their entireties.

TECHNICAL FIELD

This disclosure relates to the field of information technologies, and in particular, to an electronic device cover and an electronic device component.

BACKGROUND

With rapid development of information technologies, an electronic device is increasingly and widely used in an edge scenario of a high temperature and relatively poor air quality. To adapt to a relatively harsh environment in the edge scenario, performance of the electronic device such as dust prevention performance, heat dissipation performance, and corrosion resistance, becomes a key factor that affects market competitiveness of the electronic device. In the conventional technology, a dust filter is generally disposed at an air intake vent of a chassis of the electronic device for dust prevention. Although this solution can achieve a relatively good dust prevention effect, the setting of dust filter increases the heat dissipation drag and affecting heat dissipation performance of the electronic device. In addition, the dust filter is prone to be blocked by dust, and needs to be cleaned and maintained periodically. If maintenance is not performed in time, dust inevitably enters the chassis; and after harmful impurities in the dust are attached to a board, deliquescence of harmful impurities occurs in a humidity condition, and the board is corroded. In addition, in a running process of the electronic device, an electronic component such as the board inside the electronic device is prone to be corroded due to impact of a temperature and humidity of an environment. Consequently, performance of the electronic device is affected.

SUMMARY

This disclosure provides an electronic device cover and an electronic device component, to improve anti-corrosion performance of an electronic device without affecting heat dissipation performance of the electronic device.

According to a first aspect, this disclosure provides an electronic device cover. The electronic device cover is configured to accommodate an electronic device. A first air intake window and a first air exhaust window are disposed on the electronic device cover. The first air intake window is configured to communicate with an air intake vent of the electronic device to form an air intake channel, and the first air exhaust window is configured to communicate with an air exhaust vent of the electronic device to form an air exhaust channel. In addition, an air return channel is further disposed inside the electronic device cover, and the air return channel is configured to communicate the air exhaust channel and the air intake channel, so that a part of hot return air in the air exhaust channel may enter the air intake channel.

In the foregoing solution, the air return channel is disposed to return the part of hot air to the air intake channel, so that an air intake temperature of a chassis can be slightly increased without affecting heat dissipation performance of the electronic device. In this way, a cold air area that is inside the chassis and that is close to an air intake vent area is eliminated, relative humidity of air inside the chassis is reduced, and a risk of corrosion of an electronic component such as a board is reduced.

During specific disposition, the electronic device cover may include a top panel, a first side panel, and a bottom panel. The first side panel is connected between the top panel and the bottom panel. A baffle plate is disposed on an inner wall of the first side panel. The baffle plate is disposed obliquely relative to the bottom panel. The air intake channel and the air exhaust channel are respectively located on two sides of the baffle plate, and a gap between the baffle plate and the bottom panel may form a part of the air return channel. In this way, in the air return channel, hot return air from a side that is of the baffle plate and that is close to the air exhaust channel enters a side close to the air intake channel side mainly through the gap between the baffle plate and the bottom panel, so that hot return air supplied to a lower area of the air intake channel is relatively sufficient. This helps make a temperature of mixed air formed inside the air intake channel more balanced.

Specific disposing positions of the first air intake window and the first air exhaust window are not limited. In a possible implementation, the first air intake window and the first air exhaust window are disposed on the first side panel. In this case, the air return channel is formed between the first side panel and a panel of the electronic device, to make disposition of the air return channel easier, and simplify a structure of the electronic device cover.

In a specific implementation, the baffle plate is located between the first air intake window and the first air exhaust window.

During specific disposition of the baffle plate, the baffle plate may include a first end, a second end, a third end, and a fourth end. The first end and the second end are opposite to each other, the third end is an end that is of the baffle plate and that is close to the top panel, and the fourth end is an end that is of the baffle plate and that is close to the bottom panel. When the electronic device is disposed inside the electronic device cover, the first end may press against a panel of the chassis, the second end is connected to the first side panel, the third end is connected to the top panel or the third end and the top panel is disposed at intervals, and the fourth end and the bottom panel are disposed at intervals.

A specific structure form of the baffle plate is not limited. In a specific implementation, the baffle plate is of a straight plate structure, and the baffle plate and the top panel is disposed orthogonally. Alternatively, the baffle plate is disposed obliquely facing one side of the air intake channel, that is, an included angle between a side that is of the baffle plate and that is close to the air intake channel and the top panel is an acute angle.

During specific implementation, the third end of the baffle plate is connected to the top panel. In this case, in the air return channel, the hot return air from the side that is of the baffle plate and that is close to the air exhaust channel can enter, only through the gap between the baffle plate and the bottom panel, the side close to the air intake channel, to make the temperature of the mixed air formed inside the air intake channel more balanced. In addition, an air guide is further disposed inside the electronic device cover. The air guide is specifically disposed inside the air return channel, and is configured to guide the hot return air to the air intake channel through the gap between the baffle plate and the bottom panel, so that the hot return air can enter the air intake channel more regularly and efficiently, thereby improving efficiency of forming mixed air.

A specific structure form of the air guide is not limited. For example, in a specific implementation, the air guide includes a plurality of guide vanes, and the plurality of guide vanes is disposed at intervals on the inner wall of the first side panel. In this way, a first guide trough is formed between two adjacent guide vanes.

When the included angle between the side that is of the baffle plate and that is close to the air intake channel and the top panel is an acute angle, there is a plurality of baffle plates. The plurality of baffle plates is disposed at intervals on the inner wall of the first side panel, and third ends of the plurality of baffle plates are successively far away from the top panel. In this way, a second guide trough of the air return channel is formed between two adjacent baffle plates. One end that is of the second guide trough and that communicates with the air intake channel is disposed close to the bottom panel. In this way, the hot return air from the air exhaust channel is regularly guided to the lower area that is of the air intake channel and that is close to the bottom panel. This helps the temperature of the mixed air formed inside the air intake channel more balanced.

In another specific implementation, the baffle plate may alternatively be of a bent plate structure. In this case, there are one or more baffle plates. When there is one baffle plate, a third end of the baffle plate is connected to the top panel, and a fourth end of the baffle plate may bend towards one side of the air intake channel. In this case, the hot return air from the side that is of the baffle plate and that is close to the air exhaust channel can enter, only through the gap between the baffle plate and the bottom panel, the side close to the air intake channel, to make the temperature of the mixed air formed inside the air intake channel more balanced. In addition, a bending shape of the baffle plate may also have a function of guiding airflow, to guide the hot return air to the lower area that is of the air intake channel and that is close to bottom panel.

When there are a plurality of baffle plates, the plurality of baffle plates is disposed at intervals on the inner wall of the first side panel, and third ends of the plurality of baffle plates are successively far away from the top panel. In this way, a second guide trough of the air return channel is formed between two adjacent baffle plates. One end that is of the second guide trough and that communicates with the air intake channel is disposed close to the bottom panel. In this way, the hot return air from the air exhaust channel is regularly guided to the lower area that is of the air intake channel and that is close to the bottom panel. This helps the temperature of the mixed air formed inside the air intake channel more balanced.

When the bent plate structure is used, the baffle plate is specifically in a structure form such as an arc-shaped plate, a combination plate formed by connecting a plurality of straight plates, or a combination plate formed by connecting a straight plate and an arc-shaped plate.

In a possible implementation, sound-absorbing cotton is disposed on an inner wall of the electronic device cover. In this way, noise generated when the electronic device works can be isolated inside the electronic device cover by using the sound-absorbing cotton.

When the sound-absorbing cotton is disposed on the inner wall of the electronic device cover, the sound-absorbing cotton is specifically bonded and fastened to the inner wall of the electronic device cover through an adhesive, to ensure connection reliability between the sound-absorbing cotton and the inner wall of the electronic device cover.

The first air intake window and the first air exhaust window is shutters. Blades of the shutters is specifically bent blades. The blades each include a first bent portion and a second bent portion. The first bent portion is disposed close to the inside of the electronic device cover relative to the second bent portion, and an included angle between the first bent portion and the second bent portion is less than 180 degrees. In this design, an air intake hole formed between two adjacent blades is a bent hole; and when a sound inside the electronic device cover passes through the air intake hole, a plurality of reflections or refractions occurs. During the plurality of reflections and refractions, a part of sound energy is absorbed by air. In this way, the sound that finally spreads out the electronic device cover can be weakened, thereby further reducing noise.

In a possible implementation, the electronic device includes a chassis, and the air intake vent and the air exhaust vent are respectively disposed on two panels on two opposite sides of the chassis. The electronic device cover further includes a second side panel and a third side panel that are opposite to each other, the second side panel and the third side panel are respectively connected to two sides of the first side panel, and the second side panel is disposed opposite to a panel on a side that is of the chassis and on which the air intake vent is disposed.

According to the foregoing solution, the air intake channel may include two parts: a first part formed between an area that is of the first side panel and that is close to the second side panel and a panel of the chassis, and a second part formed between the second side panel and the panel of the chassis. The air exhaust channel may also include two parts: a third part formed between an area that is of the first side panel and that is close to the third side panel and the panel of the chassis, and a fourth part formed between the third side panel and the panel of the chassis.

In a possible implementation, a second air intake window is disposed on a side that is of the top panel and that is close to the second side panel, and the second air intake window communicates with the air intake channel. A second air exhaust window is disposed on a side that is of the top panel and that is close to the third side panel, and the second air exhaust window communicates with the air exhaust channel. In this way, an air intake path and an air exhaust path is increased, and heat dissipation efficiency of the electronic device is improved.

In a possible implementation, a third air intake window is disposed on the second side panel. The third air intake window communicates with the air intake channel, and the third air intake window is a switch window. The electronic device component is used in different scenarios by adjusting an open state or a closed state of the third air intake window.

In a possible implementation, the electronic device cover is used in an outdoor environment. A relative humidity of air inside the electronic device is relatively low, deliquescence does not occur on even if highly corrosive substances such as sodium chloride and potassium chloride outside the electronic device enter the electronic device. Therefore, no corrosion effect is caused on an electronic component.

According to a second aspect, this disclosure further provides an electronic device component. The electronic device component includes an electronic device and the electronic device cover in any one of the foregoing possible implementations. The electronic device is disposed inside the electronic device cover. The electronic device cover may reduce a relative humidity inside the electronic device by adjusting an air intake temperature of the electronic device, so that a risk of corrosion on an electronic component inside the electronic device can be reduced, and corrosion resistance performance of the electronic device can be improved.

In a possible implementation, the electronic device is a server.

In a possible implementation, the electronic device is a network device.

In a possible implementation, the electronic device is a storage device.

In a possible implementation, the electronic device is an electronic device that is used in an outdoor environment.

REFERENCE NUMERALS

Figure 1:
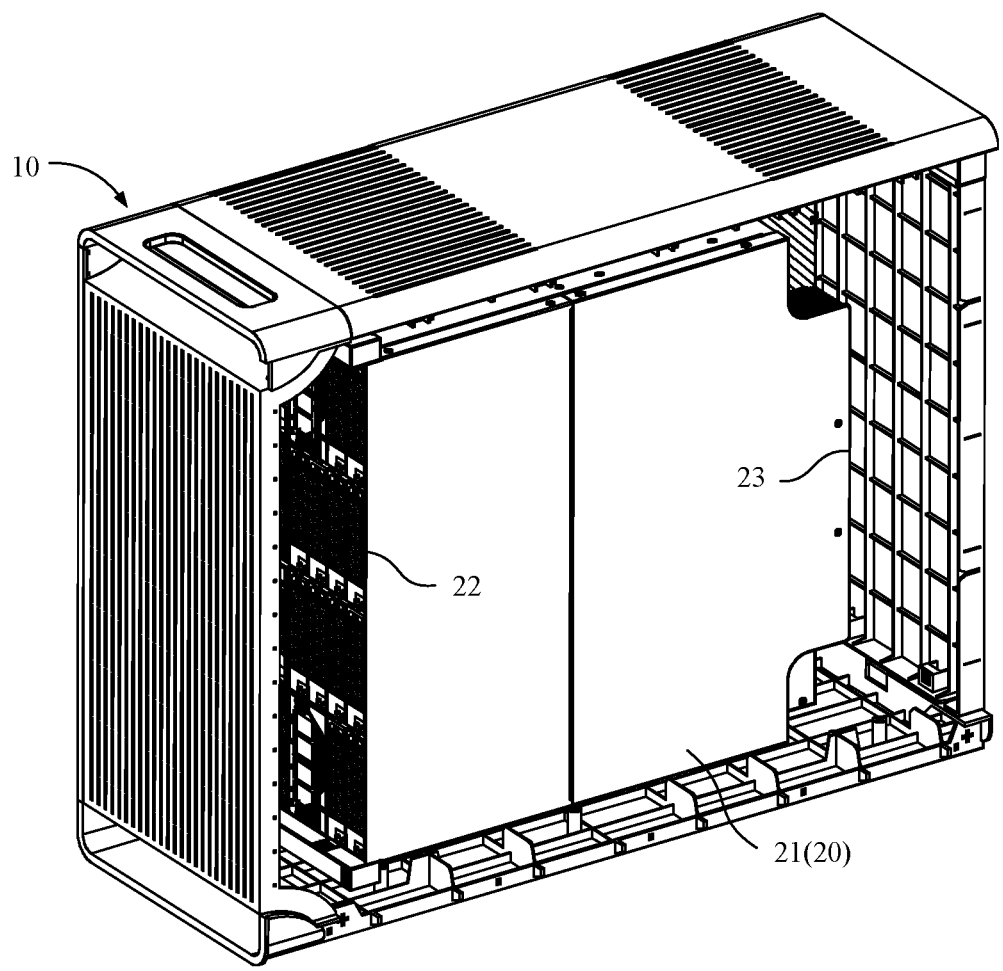
FIG. 1 is a schematic diagram of a local structure of an electronic device component according to an embodiment of this disclosure.

10: Electronic device cover; 20: Electronic device; 21: Chassis; 22: Air intake vent; 23: Air exhaust vent; 11—First air intake window;
12: First air exhaust window; 101: Top panel; 102: Bottom panel; 103: First side panel; 104: Second side panel; 105: Third side panel;
30: Air intake channel; 31: First part; 32: Second part; 40: Air exhaust channel; 41: Third part; 42: Fourth part;
50: Air return channel; 13: Baffle plate; 14: Air guide; 141: Guide vane; 142: First guide trough;
131: Second guide trough; 15: Second air intake window; 16: Second air exhaust window; 17: Third air intake window; 111—third air intake window;
112: First bent portion; 113: Second bent portion; and 114: Air intake vent.

DESCRIPTION OF EMBODIMENTS

To make the objectives, technical solutions, and advantages of this disclosure clearer, the following further describes this disclosure in detail with reference to the accompanying drawings.

For ease of understanding of an electronic device cover provided in the embodiments of this disclosure, the following first describes an application scenario of the electronic device cover. A camera module provided in the embodiments of this disclosure is configured to accommodate an electronic device. The electronic device is a device in the conventional technology, such as a server, a communications device, a network device, a storage device, a router, or a switch. With rapid development of an internet technology and a 5G technology, the electronic device is increasingly and widely used in an edge scenario in a relatively harsh environment. To adapt to conditions such as a high temperature, poor air quality, and a low noise requirement in the edge scenario, features of the electronic device, such as heat dissipation, dust prevention, noise reduction, and corrosion resistance, need to be continuously improved. In the conventional technology, a dust filter is generally disposed at an air intake vent of a chassis of the electronic device for dust prevention. An advantage of this solution is a relatively good dust prevention effect. A disadvantage of this solution is that cooling wind resistance increases due to disposition of the dust filter, which affects heat dissipation performance of the electronic device. In addition, the dust filter is prone to be blocked by dust, and needs to be cleaned and maintained periodically. If maintenance is not performed in time, the dust enters the chassis, and after harmful corrosive impurities in the dust are attached to a board, and deliquescence occurs in a humidity condition, the board is corroded. In a serious case, the board is short-circuited. In addition, in a running process of the electronic device, an electronic component such as the board inside the electronic device is prone to be corroded due to impact of a temperature and humidity of an environment. Consequently, performance of the electronic device is affected.

Based on this, this disclosure provides an electronic device cover and an electronic device component using the electronic device cover. The electronic device cover can improve anti-corrosion performance of an electronic device without affecting heat dissipation performance of the electronic device.

Referring to FIG. 1, an electronic device cover 10 provided in an embodiment of this disclosure is configured to accommodate an electronic device 20. The electronic device 20 may include a chassis 21 and components such as a board and a fan disposed inside the chassis 21. An air intake vent 22 and an air exhaust vent 23 are disposed on the chassis 21. During specific disposition, the air intake vent 22 and the air exhaust vent 23 is disposed on two panels on two opposite sides of the chassis 21. An air intake side of the fan is disposed facing the air intake vent 22, and an air exhaust side of the fan is disposed facing the air exhaust vent 23. In this way, cold air outside the chassis 21 enters the chassis 21 from the air intake vent 22 under a suction effect of the fan, and the cold air entering the chassis 21 heats up after exchanging heat with an electronic component. Then, the heated air is discharged out of the chassis 21 through the air exhaust vent 23 under an exhaust effect of the fan, to implement heat dissipation for the electronic device 20.

It should be noted that a relative humidity of air inside the chassis 21 is an important indicator that affects corrosion of the related electronic component. Take the board as an example, most of cables on the board are made of copper, and a threshold relative humidity for copper to corrode in air is 60%. In an environment in which a relative humidity is above the threshold, a corrosion speed of the copper increases as the relative humidity value increases. In addition, when in the environment in which a relative humidity is above the threshold, a resistance of the insulation resistance on the board surface decreases as the relative humidity increases. The relative humidity ranging from 60% to 65% is a turning point at which the resistance of the insulation resistance decreases. However, when the relative humidity is below 60%, deliquescence does not occur on a highly corrosive substance in the air such as sodium chloride and potassium chloride, thus no corrosion effect by the air is caused on the electronic component.

Therefore, a risk of corrosion of the board can be reduced by controlling the relative humidity of the air inside the chassis 21. Please be note that, when an absolute humidity remains unchanged, a higher temperature lead to a lower relative humidity. According to this principle, slightly increasing an air intake temperature of the chassis 21 is able to reduces the relative humidity. Meanwhile, normal heat dissipation of the electronic device 20 is not affected by the temperature slightly increasing of the air intake. In this embodiment of this disclosure, the air intake temperature of the chassis 21 is increased by disposing the electronic device cover 10.

Figure 2:
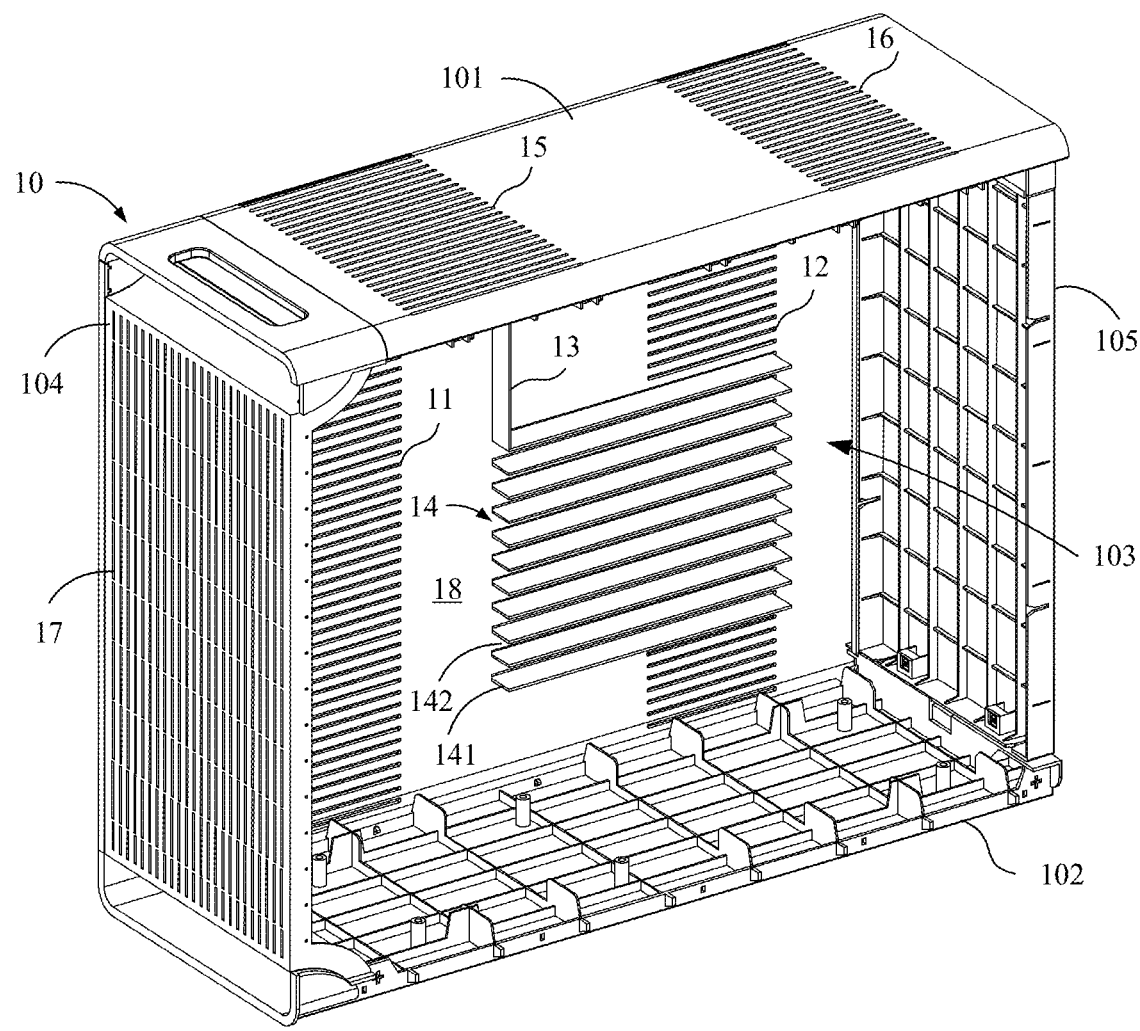
FIG. 2 is a schematic diagram of a local structure of an electronic device cover according to an embodiment of this disclosure.

During specific implementation, referring to FIG. 2, a first air intake window 11 and a first air exhaust window 12 are disposed on the electronic device cover 10. The first air intake window 11 is configured to communicate with the air intake vent 22 of the chassis 21 to form an air intake channel between the first air intake window 11 and the air intake vent 22. The first air exhaust window 12 is configured to communicate with an air exhaust vent 23 of the chassis 21 to form an air exhaust channel between the first air exhaust window 12 and the air exhaust vent 23. When dissipate heat for the electronic device 20, fresh air outside the electronic device cover 10 enters the electronic device cover 10 through the first air intake window 11, the fresh air flows through the air intake channel, and enters the chassis 21 through the air intake vent 22. After heat exchange with the electronic component inside the chassis 21, the fresh air is discharged out of the chassis through the air exhaust channel 23, flows through the air exhaust channel, and is discharged out of the electronic device cover 10 through the first air exhaust window 12, then one heat exchange cycle is completed.

The electronic device cover 10 further provides an air return channel. The air return channel separately communicate with the air exhaust channel and the air intake channel. A part of hot air inside the air exhaust channel is able to enter the air intake channel through the air return channel, and is mixed with the fresh air entering the air intake channel through the first air intake window 11, to form mixed air whose temperature is slightly higher than that of the fresh air. Under the action of a fan, the mixed air enters the chassis 21 through the air intake channel 22, to increase an air intake temperature of the air intake channel 22. In this way, a cold air area that is inside the chassis 21 and that is close to the air intake vent 22 is eliminated, additionally, the relative humidity of the air inside the chassis 21 is reduced, hence, a risk of corrosion of the electronic component such as the board is reduced. In addition, even in an scenario with relatively poor air quality, for example, in an outdoor environment, because the relative humidity of air inside the chassis is relatively low, deliquescence does not occur on the highly corrosive substance such as sodium chloride and potassium chloride that enters the chassis with the air, and no corrosion effect is caused on the electronic component.

Still referring to FIG. 2, the electronic device cover 10 is specifically of a hexahedron structure, including a top panel 101, a bottom panel 102, a first side panel 103, a second side panel 104, a third side panel 105, and a fourth side panel (not shown in the figure). The top panel 101 and the bottom panel 102 are opposite to each other, the first side panel 103 and the fourth side panel are opposite to each other, and the second side panel 104 and the third side panel 105 are opposite to each other. When the electronic device is disposed inside the electronic device cover 10, the second side panel 104 is disposed opposite to a panel of a side on which the air intake vent is disposed on the chassis, and the third side panel 105 is disposed opposite to a panel on a side that is on the chassis and on which the air exhaust vent is disposed.

In this embodiment of this disclosure, the foregoing first air intake window 11 and the first air exhaust window 12 is disposed on the first side panel 103. In specific disposition, the first air intake window 11 is located on a side that is on the first side panel 103 and that is close to the second side panel 104, and the first air exhaust window 12 is located on a side that is on the first side panel 103 and that is close to the third side panel 105. The first air intake window 11 and the first air exhaust window 12 may alternatively be disposed on the fourth side panel. In specific disposition, the first air intake window 11 is located on a side that is on the fourth side panel and that is close to the second side panel 104, and the first air exhaust window 12 is located on a side that is on the fourth side panel and that is close to the third side panel 105. To improve a heat dissipation effect on the electronic device, in other embodiments of this disclosure, the first air intake window 11 and the first air exhaust window 12 is disposed on each of the third side panel 105 and the fourth side panel, thereby increasing a number of air intake paths and air exhaust paths, and improving heat dissipation efficiency.

An example in which the first air intake window 11 and the first air exhaust window 12 are disposed on the first side panel 103 is used in the following to specifically describe a structure of the first side panel 103 and disposition forms of an air intake channel, an air exhaust channel, and an air return channel.

Figure 3:
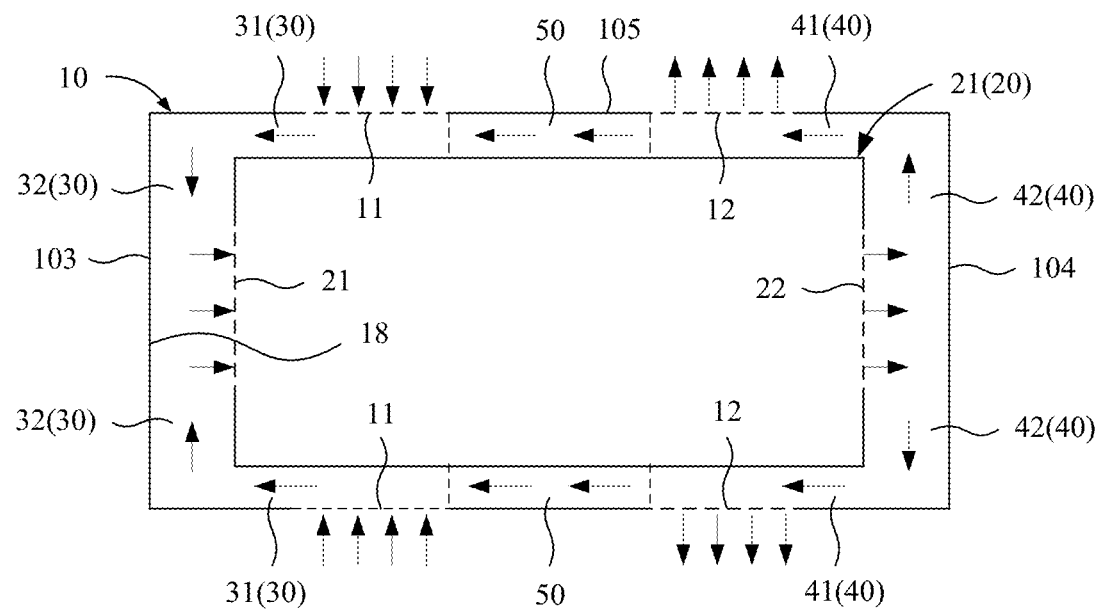
FIG. 3 is a schematic diagram of a flow direction of airflow inside an electronic device cover according to an embodiment of this disclosure.

Referring to FIG. 3, in this embodiment of this disclosure, an air intake channel 30 includes two parts: a first part 31 formed between a panel of the chassis 21 and an area that is of the first side panel 103 and that is close to the second side panel 104, and a second part 32 formed between the second side panel 104 and the panel of the chassis 21. An air exhaust channel 40 also includes two parts: a third part 41 formed between an area that is of the first side panel 103 and that is close to the third side panel 105 and the panel of the chassis 21, and a fourth part 42 formed between the third side panel 105 and the panel of the chassis 21. An air return channel 50 is also formed between the first side panel 103 and the panel of the chassis 21. The air return channel 50 is located between the first part 31 and the third part 41, and respectively communicates with the first part 31 and the third part 41. In this way, a setting difficulty of the air return channel 50 is reduced, and a structure of the electronic device cover 10 is simplified.

Because hot air rises, a temperature of hot return air close to the top panel 101 in the air return channel 50 is generally higher than a temperature of hot return air close to the bottom panel 102. After the hot return air in the return air channel 50 enters the air inlet channel 30, the hot return air is mixed with the fresh air to form mixed air, and the upper part of the mixed air and the lower part of the mixed air are unbalanced in temperature, which affects the effect of adjusting the relative humidity of the air in the chassis. Therefore, this imbalance needs to be avoided as much as possible. In this embodiment of this disclosure, referring to FIG. 2 and FIG. 3, a baffle plate 13 is disposed on an inner wall of the third side panel 105. The baffle plate 13 is disposed obliquely relative to the bottom panel, and is specifically located between the first air intake window 11 and the first air exhaust window 12. In this case, the air intake channel and the air exhaust channel are respectively located on two sides of the baffle plate, and a gap between the baffle plate and the bottom panel form a part of the air return channel. Because of the baffle plate 13 is disposed in this way, in the air return channel 50, hot return air from a side that is of the baffle plate and that is close to the air exhaust channel 40 mainly enters a side close to the air intake channel 30 through a gap between the baffle plate 13 and the bottom panel 102. In this way, Although the hot air still rises on the hot return air near the air inlet passage 30, the hot return air in the lower part is relatively sufficient because the gap between the baffle plate 13 and the bottom plate 102 continuously supplies the hot return air. Therefore, after the hot return air enters the air intake channel 30 and is mixed with the fresh air, the mixed air with a more balanced temperature can be obtained.

In this embodiment of this disclosure, that the baffle plate is obliquely relative to the bottom panel includes that the baffle plate is perpendicular to the bottom panel, which means that the baffle plate and the bottom panel are not parallel. Therefore, the hot return air near the air outlet channel 40 mainly arrives the side near the air inlet channel 30 through the gap between baffle 13 and baseplate 102, so that the hot return air at the bottom is relatively more sufficient. Therefore, after the hot return air enters the air intake channel 30 and mixes with the fresh air, the mixed air with a more balanced temperature is obtained.

The baffle plate 13 may include a first end, a second end, a third end, and a fourth end. The first end and the second end are opposite to each other, the third end is an end that is of the baffle plate 13 and that is close to the top panel 101, and the fourth end is an end that is of the baffle plate 13 and that is close to the bottom panel 102. When the electronic device is disposed inside the electronic device cover 10, the first end press against the panel of the chassis, the second end is connected to the first side panel, the third end is connected to the top panel 101 or the third end and the top panel 101 is disposed at intervals, and the fourth end and the bottom panel 102 are disposed at intervals.

Figure 4:
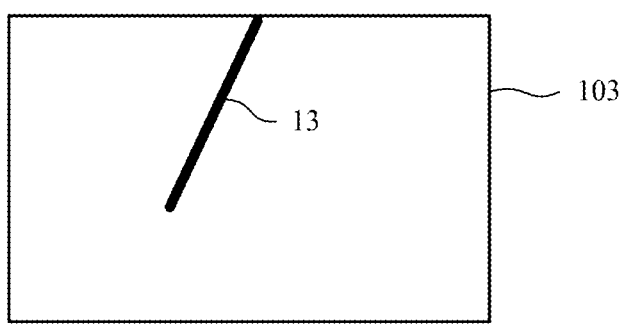
FIG. 4 is a schematic diagram of a local structure of a first side panel according to an embodiment of this disclosure.

A specific structure form of the baffle plate 13 is not limited. In a specific embodiment of this disclosure, the baffle plate 13 is specifically of a straight plate structure, and the baffle plate 13 and the top panel 101 is disposed orthogonally. Alternatively, referring to FIG. 4, the baffle plate 13 is disposed obliquely facing one side of the air intake channel 30, that is, an included angle between the top panel 101 and a side that is of the baffle plate 13 and that is close to the air intake channel 30 is an acute angle. In this case, the third end of the baffle plate 13 is connected to the top panel 101, so that the hot return air from a side that is of the baffle plate 13 and that is close to the air exhaust channel 40 can enter the side close to the air intake channel 30 only through the gap between the baffle plate 13 and the bottom panel 102, so that a temperature of the mixed air formed inside the air intake channel 30 is more balanced. In another specific embodiment of this disclosure, the baffle plate 13 is specifically of a straight plate structure. Referring to FIG. 4, the baffle plate 13 is disposed obliquely facing one side of the air intake channel 30, that is, an included angle between the top panel 101 and the side that is of the baffle plate 13 and that is close to the air intake channel 30 is an acute angle. However, the third end of the baffle plate 13 and the top panel 101 are disposed at intervals, and the fourth end and the bottom panel 102 are disposed at intervals.

Referring to FIG. 2 and FIG. 3, an air guide 14 is further disposed inside the electronic device cover 10. The air guide 14 is specifically disposed inside the air return channel 50. The air guide 14 may guide the hot return air to the air intake channel 30 through the gap between the baffle plate and the bottom panel, to ensure that the hot return air can enter the air intake channel 30 more regularly and efficiently, thereby improving efficiency of forming the mixed air.

A specific structure form of the air guide 14 is not limited. For example, in a specific embodiment of this disclosure, the air guide 14 includes a plurality of guide vanes 141 disposed in parallel. The plurality of guide vanes 141 is fixed at intervals on an inner wall of the third side panel 105. In this way, a first guide trough 142 is formed between two adjacent guide vanes 141. During specific implementation, a quantity of first guide trough 142 is set based on a specific application scenario of the electronic device component. For example, when an ambient temperature in the application scenario is relatively high, there is a relatively small quantity of guide trough 142; and when the ambient temperature in the application scenario is relatively low, there is a relatively large quantity of guide trough 142.

Figure 5:
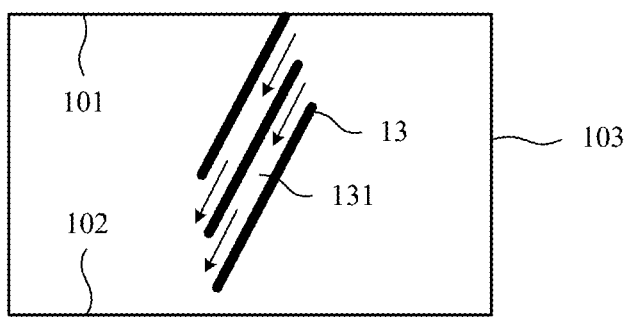
FIG. 5 is a schematic diagram of a local structure of a first side panel according to another embodiment of this disclosure.

With reference to FIG. 3 and FIG. 5, when the fourth end of the baffle plate 13 is disposed obliquely facing one side of the air intake channel 30, there is a plurality of baffle plates 13. The plurality of baffles 13 are fixed to the inner wall 18 of the first side plate 103 at intervals. In a specific embodiment, a third end of a baffle 13 in the plurality of baffles 13 that is closest to the top plate 101 is connected and disposed to the top plate 101, and third ends of the other baffles 13 in the plurality of baffles 13 are successively away from the top plate 101. In this way, Second guide trough 131 of the return air passage 50 can be formed between every two adjacent baffles 13. It can be learned that an end that is of the second guide trough 131 which communicates with the air exhaust channel 40 is close to the top plate 101, and an end that is of the second guide groove 131 and that is of the air intake channel 30 is close to the bottom plate 102, so that hot return air of the air exhaust channel 40 can be guided to a lower area of the air intake channel 30, wherein the lower region is close to the bottom plate 102, thereby facilitating a more balanced temperature of the air mixture formed in the air intake channel 30. In another embodiment, the plurality of baffles 13 are disposed at an interval from the top plate 101, and third ends of the baffles 13 are successively away from the top plate 101. In this way, second guide troughs 131 of the return air channel 50 are formed between each two adjacent baffles 13.

In addition, in some other possible embodiments of this disclosure, the foregoing baffle plate is a bent plate structure. A specific structure form of the bent plate is not limited, for example, is a combination plate formed by connecting a plurality of straight plates, an arc plate, or a combination plate formed by connecting a straight plate and an arc plate.

Figure 6:
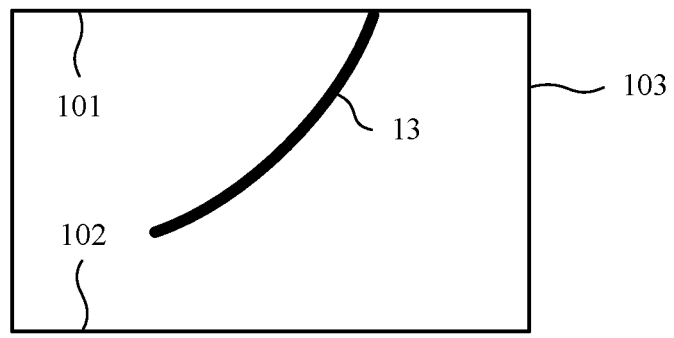
FIG. 6 is a schematic diagram of a local structure of a first side panel according to still another embodiment of this disclosure.

When the bent plate is used, there is one or more baffle plates. Referring to FIG. 3 and FIG. 6, when there is one baffle plate 13, the third end of the baffle plate 13 is connected to the top panel 101, and the fourth end of the baffle plate 13 bend towards one side of the air intake channel 30. In this case, hot return air from a side that is of the baffle plate 13 and that is close to the air exhaust channel 40 can enter, only through the gap between the baffle plate 13 and the bottom panel 102, the side close to the air intake channel 30, which cause the temperature of the mixed air formed inside the air intake channel 30 more balanced. In addition, based on a bending shape of the baffle plate 13, the baffle plate 13 also have a function of guiding airflow, to guide the hot return air to the lower area that is of the air intake channel 30 and that is close to bottom panel 102. In another possible embodiment, the third end of the baffle plate 13 and the top panel 101 are disposed at intervals, and the fourth end and the bottom panel 102 are disposed at intervals.

Figure 7:
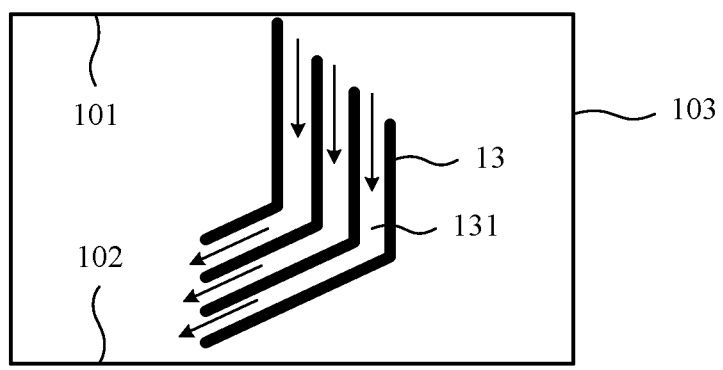
FIG. 7 is a schematic diagram of a local structure of a first side panel according to yet another embodiment of this disclosure.

When there are a plurality of baffle plates 13, referring to FIG. 7, the plurality of baffle plates 13 are fastened at intervals on the inner wall of the first side panel 103. In addition, in specific disposition, for a special baffle plate 13 closest to the top panel 101 in the plurality of baffles 13, a third end of the special baffle plate 13 is connected to the top panel 101, and third ends of other baffle plates 13 are successively away from the top panel 101, so that a second guide trough 131 of the air return channel 50 is formed between two adjacent baffle plates 13. Similarly, one end that is of the second guide trough 131 and that communicates with the air exhaust channel 40 is disposed close to the top panel 101, and another end that is of the second guide trough 131 and that communicates with the air intake channel 30 is disposed close to the bottom panel 102. In this way, the heat return air from the air exhaust channel 40 can be guided to the lower area that is of the air intake channel 30 and that is close to the bottom panel 102, and this helps make the temperature of the mixed air formed inside the air intake channel 30 more balanced. In another embodiment, the third ends of the plurality of baffle plates 13 and the top panel 101 are disposed at intervals, and the third ends of the baffle plates 13 are successively away from the top panel 101.

Figure 8:
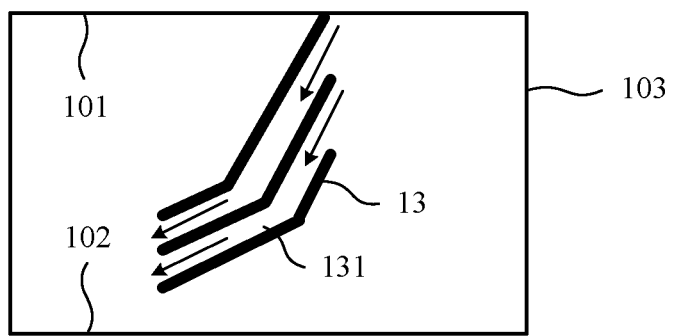
FIG. 8 is a schematic diagram of a local structure of a first side panel according to still yet another embodiment of this disclosure.

In the embodiment shown in FIG. 7, a structure of the baffle plate 13 is formed by two straight plates with an obtuse angle. In the two straight plates, one straight plate close to the bottom panel 102 is disposed obliquely facing one side of the air intake channel, and another straight plate close to the top panel 101 and the top panel is disposed orthogonally, or the another straight plate close to the top panel 101 is disposed obliquely facing one side of the air intake channel as shown in FIG. 8. This is not limited in this disclosure. In addition, the straight plate close to the top panel 101 is connected to the top panel 101, or the top panel 101 and the straight plate close to the top panel 101 is disposed at intervals.

Figure 9:
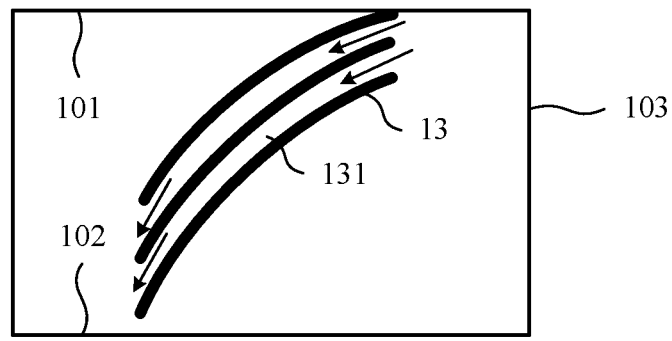
FIG. 9 is a schematic diagram of a local structure of a first side panel according to a further embodiment of this disclosure.
Figure 10:
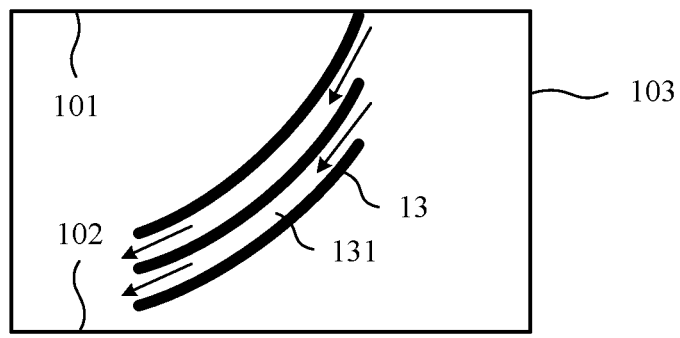
FIG. 10 is a schematic diagram of a local structure of a first side panel according to a still further embodiment of this disclosure.

In some embodiments of this disclosure, the baffle plate 13 may alternatively be an arc plate shown in FIG. 9 or FIG. 10. During specific disposition, the baffle plate 13 may protrude towards an air intake channel side as shown in FIG. 9, or may protrude towards an air exhaust channel side as shown in FIG. 10. This is also not limited in this disclosure. Alternatively, there is one arc plate, the arc plate is connected to the top panel 101, or the arc plate and the top panel 101 is disposed at intervals.

When the first air intake window 11 and the first air exhaust window 12 are respectively disposed on the fourth side panel, structure of the fourth side panel and symmetrical of the first side panel 103 are symmetrical, and details are not described herein again.

In the foregoing embodiments, based on the air return channel 50, the air mixing function and an airflow-guiding function of the baffle plate 13, air intake temperature of the air intake vent of the chassis is increased by about 3° C. In this way, the cold air area that is inside the chassis and that is close to the air intake vent can be eliminated, the relative humidity of the air inside the chassis can be reduced to below 60%, and the risk of corrosion of the electronic component such as the board can be reduced.

Referring to FIG. 2, in this embodiment of this disclosure, a second air intake window 15 is further disposed on a side that is of the top panel 101 and that is close to the second side panel 104, and the second air intake window 15 communicates with the air intake channel. In this way, external fresh air can enter the air intake channel through both the first air intake window 11 and the second air intake window 15, in other words another air intake path is added. Similarly, a second air exhaust window 16 is further disposed on a side that is of the top panel 101 and that is close to the third side panel 105, and the second air exhaust window 16 communicates with the air exhaust channel. In this way, the hot air inside the air exhaust channel is discharged through both the first air exhaust window 12 and the second air exhaust window 16, in other words another air exhaust path is added.

In addition, referring to FIG. 2, a third air intake window 17 is disposed on the second side panel 104. The third air intake window 17 also communicates with the air intake channel. The third air intake window 17 is specifically a switch window. The electronic device component is used in different scenarios by adjusting an open state or a closed state of the third air intake window 17. Specifically, when the third air intake window 17 can in the open state, the electronic device component is used in a scenario with relatively good air quality and relatively sufficient cold air. Opening of the third air intake window 17 adds an air intake path. In this scenario, a temperature of the fresh air inside the air intake channel is relatively low, and a proportion of the hot return air is relatively small. Hence, even if the fan of the electronic device runs at a low speed, a heat dissipation requirement can be met, and a relatively small noise is generated. In addition, the external air is relatively clean, therefore, less highly corrosive substances enters the chassis and corrosiveness to the electronic component is relatively low. When the third air intake window 17 is in the closed state, the electronic device component can used in a scenario with relatively poor air quality, for example, in an outdoor environment. In this scenario, a proportion of the hot return air in the air intake channel relatively increases, so that the air intake temperature of the air intake vent entering the chassis slightly increases, thereby reducing the relative humidity of the air inside the chassis, that is, in this scenario, the risk of corrosion of the electronic component can also be reduced. Therefore, the electronic device cover and the electronic device provided in the embodiments of this disclosure is used in the outdoor environment.

In the foregoing embodiment, a specific structure form of the third air intake window 17 is not limited. For example, the third air intake window 17 is a revolving door pivoted on the first side panel through a hinge, or the third air intake window 17 is a revolving shutter.

To reduce noise impact of the electronic device on an ambient environment, sound-absorbing cotton is disposed on an inner wall of the electronic device cover 10. In this way, noise generated when the electronic device works can be isolated inside the electronic device cover 10 by using the sound-absorbing cotton. A specific type of the sound-absorbing cotton is not limited. For example, the sound-absorbing cotton is glass fiber sound-absorbing cotton or polyester fiber sound-absorbing cotton. When the sound-absorbing cotton is disposed on the inner wall of the electronic device cover 10, the sound-absorbing cotton is specifically bonded and fastened to the inner wall of the electronic device cover 10 through an adhesive, to ensure connection reliability between the sound-absorbing cotton and the inner wall of the electronic device cover 10.

It should be noted that, during disposition, the sound-absorbing cotton is required to be away from positions of the air intake windows and the air exhaust windows on the electronic device cover 10, so as to ensure that the electronic device cover 10 smoothly intakes and exhausts air.

Figure 11:
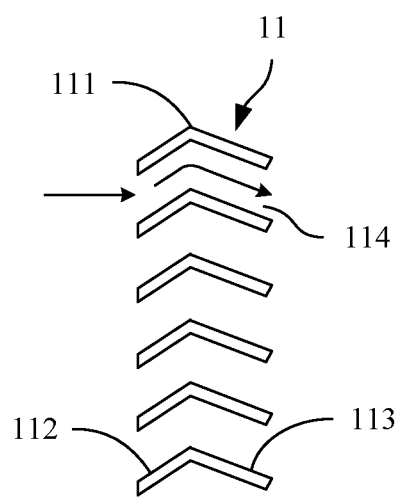
FIG. 11 is a schematic diagram of a local structure of a first air intake window according to an embodiment of this disclosure.

In addition, in this embodiment of this disclosure, the foregoing air intake windows and the air exhaust windows is shutters. The first air intake window 11 is used as an example. Referring to FIG. 11, a blade 111 of the first air intake window 11 is specifically a bent blade. The blade 111 includes a first bent portion 112 and a second bent portion 113. The first bent portion 112 is disposed close to the inside of the electronic device cover relative to the second bent portion 113, and an included angle between the first bent portion 112 and the second bent portion 113 is less than 180 degrees. In this design, an air intake hole 114 formed between two adjacent blades 111 is a bent hole. When a sound in the electronic device cover spreads out through the air intake hole 114, a plurality of reflections or refractions occurs. During the plurality of reflections and refractions, a part of sound energy is absorbed by air. In this way, the sound that finally spreads out the electronic device cover can be weakened, thereby further reducing noise. Experiments show that noise can be reduced by about 3 decibels through the shutters in combination with the sound-absorbing cotton on the inner wall of the electronic device cover, so that the electronic device meets a noise standard of 55 decibels in office scenarios.

In some other embodiments, the air intake windows and the air exhaust windows may further use a maze-type shutter to implement noise reduction. A structure of the maze-type shutter is similar to that in the conventional technology. Details are not described in this disclosure.

In addition, the electronic device component is further vertically installed in a non-cabinet scenario such as an office by disposing the electronic device cover, to improve a high-quality industrial design of an appearance of the electronic device component.

In conclusion, according to the electronic device cover provided in the embodiments of this disclosure, the air return channel is disposed to return a part of hot air to the air intake channel, so that the air intake temperature of the chassis can be slightly increased without affecting heat dissipation performance of the electronic device. In this way, the cold air area that is inside the chassis and that is close to the air intake vent is eliminated, the relative humidity of the air inside the chassis is reduced, and the risk of corrosion of the electronic component such as the board is reduced.

Referring to FIG. 1, an embodiment of this disclosure further provides an electronic device component. The electronic device component includes an electronic device 20 and the electronic device cover 10 in any one of the foregoing possible embodiments. The electronic device 20 is a server, a communications device, a network device, a storage device, a router, a switch, or the like in the conventional technology. The electronic device is disposed inside the electronic device cover 10. The electronic device cover 10 may reduce relative humidity inside the electronic device 20 by adjusting an air intake temperature of the electronic device, so that a risk of corrosion on an electronic component inside the electronic device 20 can be reduced, and corrosion resistance performance of the electronic device can be improved.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An electronic device cover, comprising:
a first air intake window disposed on the electronic device cover and comprising a portion of an air intake channel;
a first air exhaust window comprising a portion of an air exhaust channel;
an air return channel disposed inside the electronic device cover and coupling the air exhaust channel to the air intake channel;
a top panel;
a bottom panel;
a first side panel coupled to the top panel and the bottom panel and comprising an inner wall;
a baffle plate disposed on the inner wall, disposed orthogonal relative to the bottom panel, and comprising a first side and a second side, wherein the first side and the second side are opposite sides of the baffle plate, wherein the air intake channel is located on the first side, and wherein the air exhaust channel is located on the second side; and
a gap that is between the baffle plate and the bottom panel that forms a portion of the air return channel.

2. The electronic device cover of claim 1, further comprising sound-absorbing cotton disposed on the inner wall.

3. The electronic device cover of claim 1, further comprising an inside, wherein the first air intake window and the first air exhaust window are shutters, wherein the shutters comprise blades, wherein each of the blades comprises a first bent portion and a second bent portion, wherein the first bent portion is disposed proximate to the inside, and wherein an included angle between the first bent portion and the second bent portion is less than 180 degrees.

4. The electronic device cover of claim 1, wherein the electronic device cover is configured to be used in an outdoor environment.

5. The electronic device cover of claim 1, wherein the first air intake window and the first air exhaust window are disposed on the first side panel.

6. The electronic device cover of claim 5, wherein the baffle plate is located between the first air intake window and the first air exhaust window.

7. The electronic device cover of claim 1, wherein the baffle plate comprises a first end, a second end, a third end, and a fourth end, wherein the second end is coupled to the first side panel, wherein either the third end is coupled to the top panel, or the third end and the top panel are disposed at intervals, wherein the fourth end and the bottom panel are disposed at intervals, wherein the first end and the second end are opposite to each other, wherein the third end is proximate to the top panel, and wherein the fourth end is proximate to the bottom panel.

8. The electronic device cover of claim 7, wherein the baffle plate comprises a straight plate structure.

9. The electronic device cover of claim 8, wherein the third end is coupled to the top panel, and wherein the electronic device cover further comprises an air guide disposed inside the air return channel and configured to guide a part of return air from the air exhaust channel to the air intake channel through the gap.

10. The electronic device cover of claim 9, wherein the air guide comprises a plurality of guide vanes, wherein the guide vanes are disposed at intervals on the inner wall, and wherein two adjacent guide vanes of the plurality of guide vanes form a first guide trough.

11. The electronic device cover of claim 1, further comprising a chassis, wherein the chassis comprises two panels on two opposite sides, wherein the air intake vent and the air exhaust vent are respectively disposed on the two panels, wherein the electronic device cover further comprises a second side panel and a third side panel that are opposite to each other, wherein the second side panel and the third side panel are respectively coupled to two sides of the first side panel, and wherein the second side panel is disposed opposite to one of the two panels.

12. The electronic device cover of claim 11, further comprising a third air intake window disposed on the second side panel, wherein the third air intake window communicates with the air intake channel and is configured to open and close.

13. An electronic device assembly, comprising:
an electronic device comprising:
   an air intake vent; and
   an air exhaust vent; and
an electronic device cover accommodating the electronic device and comprising:
   a first air intake window disposed on the electronic device cover and communicating with the air intake vent to form an air intake channel;
   a first air exhaust window communicating with the air exhaust vent to form an air exhaust channel;
   an air return channel disposed inside the electronic device cover and coupling the air exhaust channel to the air intake channel;
   a top panel;
   a bottom panel;
   a first side panel coupled to the top panel and the bottom panel and comprising an inner wall;
   a baffle plate disposed on the inner wall, disposed orthogonal relative to the bottom panel, and comprising a first side and a second side, wherein the first side and the second side are opposite sides of the baffle plate, wherein the air intake channel is located on the first side, and wherein the air exhaust channel is located on the second side; and
   a gap that is between the baffle plate and the bottom panel that forms a portion of the air return channel.

14. The electronic device assembly of claim 13, wherein the first air intake window and the first air exhaust window are disposed on the first side panel.

15. The electronic device assembly of claim 14, wherein the baffle plate is located between the first air intake window and the first air exhaust window.

16. The electronic device assembly of claim 13, wherein the baffle plate comprises a first end, a second end, a third end, and a fourth end, wherein the first end is configured to press against the electronic device, wherein the second end is coupled to the first side panel, wherein either the third end is coupled to the top panel, or the third end and the top panel are disposed at intervals, wherein the fourth end and the bottom panel are disposed at intervals, wherein the first end and the second end are opposite to each other, wherein the third end is proximate to the top panel, and wherein the fourth end is proximate to the bottom panel.

17. The electronic device assembly of claim 16, wherein the baffle plate comprises a straight plate structure.

18. The electronic device assembly of claim 17, wherein the third end is coupled to the top panel, and wherein the electronic device cover further comprises an air guide disposed inside the air return channel and configured to guide a part of return air from the air exhaust channel to the air intake channel through the gap.

19. The electronic device assembly of claim 18, wherein the air guide comprises a plurality of guide vanes, wherein the guide vanes are disposed at intervals on the inner wall, and wherein two adjacent guide vanes of the plurality of guide vanes form a first guide trough.

20. An edge device, comprising:
a networking component comprising:
   an air intake vent; and
   an air exhaust vent; and
a cover accommodating the networking component and comprising:
   a first air intake window disposed on the cover and communicating with the air intake vent to form an air intake channel;
   a first air exhaust window communicating with the air exhaust vent to form an air exhaust channel;
   an air return channel disposed inside the cover and coupling the air exhaust channel to the air intake channel;
   a top panel;
   a bottom panel;
   a first side panel coupled to the top panel and the bottom panel and comprising an inner wall;
   a baffle plate disposed on the inner wall, disposed orthogonal relative to the bottom panel, and comprising a first side and a second side, wherein the first side and the second side are opposite sides of the baffle plate, wherein the air intake channel is located on the first side, and wherein the air exhaust channel is located on the second side; and
   a gap that is between the baffle plate and the bottom panel that forms a portion of the air return channel.

* * * * *